(12) United States Patent
Bae et al.

(10) Patent No.: US 9,880,683 B2
(45) Date of Patent: Jan. 30, 2018

(54) TOUCH PANEL AND ORGANIC LIGHT EMITTING DIODE DISPLAY DEVICE

(71) Applicant: SAMSUNG DISPLAY CO., LTD., Yongin, Gyeonggi-Do (KR)

(72) Inventors: Joo-Han Bae, Seongnam-si (KR); Jin Hwan Kim, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 63 days.

(21) Appl. No.: 14/800,819

(22) Filed: Jul. 16, 2015

(65) Prior Publication Data

US 2016/0202791 A1 Jul. 14, 2016

(30) Foreign Application Priority Data

Jan. 9, 2015 (KR) .................. 10-2015-0003501

(51) Int. Cl.
*G06F 3/044* (2006.01)
*G06F 3/041* (2006.01)
*H01L 27/32* (2006.01)

(52) U.S. Cl.
CPC ............ *G06F 3/044* (2013.01); *G06F 3/0412* (2013.01); *H01L 27/323* (2013.01)

(58) Field of Classification Search
CPC .............................. G06F 3/044; H01L 27/323
See application file for complete search history.

(56) References Cited

U.S. PATENT DOCUMENTS

| | | | | |
|---|---|---|---|---|
| 2004/0096594 A1* | 5/2004 | Takeuchi | ............ | G02B 5/3083 428/1.2 |
| 2010/0214264 A1* | 8/2010 | Kuo | ...................... | G06F 3/0412 345/174 |
| 2011/0227835 A1* | 9/2011 | Lin | ...................... | G02F 1/13338 345/173 |
| 2013/0016047 A1* | 1/2013 | Masumoto | .......... | G02F 1/13338 345/173 |
| 2013/0120676 A1* | 5/2013 | Iwahashi | .................. | B41M 3/06 349/15 |
| 2013/0258570 A1* | 10/2013 | Nashiki | .................... | G06F 3/044 361/679.01 |
| 2014/0061597 A1* | 3/2014 | Choi | .................... | H01L 51/5284 257/40 |
| 2014/0192277 A1* | 7/2014 | Yilmaz | ................. | G06F 3/0412 349/12 |
| 2015/0103032 A1* | 4/2015 | Bell | ........................ | G06F 3/044 345/174 |

FOREIGN PATENT DOCUMENTS

| | | |
|---|---|---|
| JP | 2008-197757 A | 8/2008 |
| KR | 10-0714016 B1 | 4/2007 |
| KR | 10-2011-0049476 A | 5/2011 |
| KR | 10-2012-0040413 A | 4/2012 |
| KR | 10-2013-0003245 A | 1/2013 |
| KR | 10-1381817 B1 | 4/2014 |

* cited by examiner

*Primary Examiner* — Charles Hicks
(74) *Attorney, Agent, or Firm* — Lee & Morse, P.C.

(57) ABSTRACT

A touch panel, including a phase retardation film; a wire grid polarizer on the phase retardation film; and a touch sensor unit on the phase retardation film, the touch sensor unit being adjacent to the wire grid polarizer.

9 Claims, 8 Drawing Sheets

TOUCH PANEL AND ORGANIC LIGHT EMITTING DIODE DISPLAY DEVICE

CROSS-REFERENCE TO RELATED APPLICATION

Korean Patent Application No. 10-2015-0003501, filed on Jan. 9, 2015, in the Korean Intellectual Property Office, and entitled: "Touch Panel and Organic Light Emitting Diode Display Device" is incorporated by reference herein in its entirety.

BACKGROUND

1. Field

Embodiments relate to a touch panel and an organic light emitting diode display device.

2. Description of the Related Art

A touch panel is a device that may sense a touch by a pen or a user's finger. A touch panel may be disposed on a display panel such as an organic light emitting diode display device or a liquid crystal display device and may be used as a means to input a signal to the display device.

SUMMARY

Embodiments may be realized by providing a touch panel, including a phase retardation film; a wire grid polarizer on the phase retardation film; and a touch sensor unit on the phase retardation film, the touch sensor unit being adjacent to the wire grid polarizer.

The wire grid polarizer may include a plurality of wires extended in a first direction on the phase retardation film, the wires being spaced from each other in a second direction intersecting the first direction.

The wire grid polarizer may further include a blackening layer on surfaces of the wires.

The touch sensor unit may be on the wire grid polarizer.

The touch sensor unit may include a first insulating layer covering the wire grid polarizer, the first insulting layer including a plurality of contact holes spaced from each other in the first direction, the plurality of contact holes exposing a part of the wires of the wire grid polarizer; a plurality of first touch pad units on the first insulating layer, the first touch pad units being spaced from each other in the second direction; connection units on the first insulating layer, the connection units connecting the plurality of first touch pad units to each other; and a plurality of second touch pad units on the first insulating layer, the second touch pad units being spaced from each other in the first direction, the second touch pad units being connected to the wires of the wire grid polarizer via the contact holes.

The first touch pad units and the connection units may be integrally formed.

The second touch pad units may be on a same layer as the first touch pad units.

The first touch pad units and the second touch pad units may each include light-transmitting conductive layers.

The first touch pad units and the second touch pad units may each include light semi-transmitting conductive layers.

The touch panel may further include a second insulating layer covering the first touch pad units and the second touch pad units. Each of a thickness of the first insulating layer and a thickness of the second insulating layer may be regulated such that a first light reflected by the wire grid polarizer and a second light reflected by the first touch pad units and the second touch pad units generate destructive interference.

The touch panel may further include a protective layer covering the wire grid polarizer. The touch sensor unit may be on the protective layer.

The wire grid polarizer may be on a front surface of the phase retardation film, and the touch sensor unit may be on a rear surface of the phase retardation film.

The phase retardation film may be a λ/4 phase retardation film.

Embodiments may be realized by providing an organic light emitting diode display device, including a display panel including an organic light emitting element; and a touch panel including a phase retardation film on the display panel, a wire grid polarizer on the phase retardation film, and a touch sensor unit on the phase retardation film, the touch sensor unit being adjacent to the wire grid polarizer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
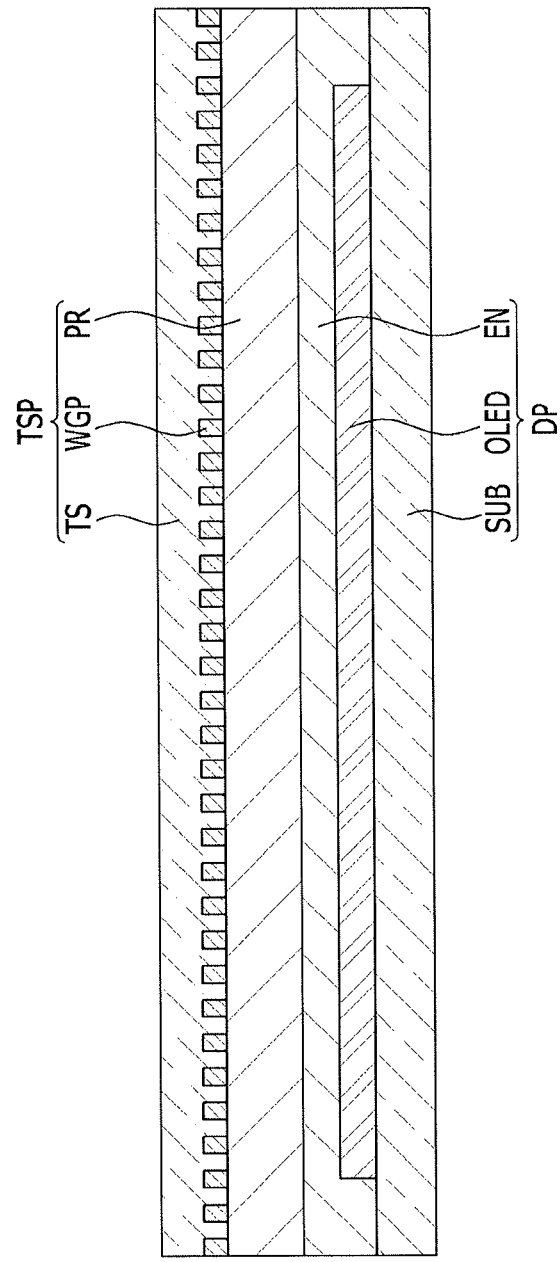
FIG. 1 illustrates a cross-sectional view of an organic light emitting diode display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the drawings, unrelated parts are omitted for clarity of explanation, and like reference numerals refer to like constituent elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

In addition, unless explicitly described to the contrary, the word "comprise" and variations such as "comprises" or "comprising", will be understood to imply the inclusion of stated elements but not the exclusion of any other elements. Further, the term "on" as used in the whole specification means that one element is disposed above or under a target element, but does not mean that one element is not necessarily disposed at an upper part based on the direction of gravity.

Hereinafter, referring to FIG. 1 to FIG. 4, an organic light emitting diode display device according to an exemplary embodiment will be described.

FIG. illustrates a cross-sectional view of an organic light emitting diode display device according to an exemplary embodiment.

As illustrated in FIG. 1, an organic light emitting diode display device according to an exemplary embodiment may be flexible, stretchable, foldable, bendable, or rollable, and may include a display panel (DP) displaying an image and a touch panel (TSP) sensing a touch.

The display panel (DP) may include a substrate (SUB), an organic light emitting element (OLED), and an encapsulator (EN).

The substrate (SUB) may be flexible, stretchable, foldable, bendable, or rollable.

Since a flexible substrate 100 may be flexible, stretchable, foldable, bendable, or rollable, the entire display panel (DP) may be flexible, stretchable, foldable, bendable, or rollable. For example, the substrate (SUB) may be formed into a flexible film including a resin such as, for example, a polyimide.

In an exemplary embodiment, the substrate (SUB) may include a resin, such as, for example, a flexible polyimide. In an exemplary embodiment, the substrate may include, for example, an organic compound, sapphire, or quartz.

The organic light emitting element (OLED) may be positioned on the substrate (SUB).

The organic light emitting element (OLED) may include two electrodes and an organic light emitting layer positioned between the two electrodes, and at least one of the two electrodes may be formed into a light-transmitting electrode. The organic light emitting element (OLED) may have various structures, and may emit light to display an image. Between the organic light emitting element (OLED) and the substrate (SUB), signal wires such as gate lines, and data lines, a plurality of thin film transistors connected to the signal wires, and at least one capacitor may be provided. The signal wires, the plurality of thin film transistors and the at least one capacitor may have various structures.

The encapsulator (EN) may be positioned on the substrate (SUB) with the organic light emitting element (OLED) interposed therebetween, and may enclose the organic light emitting element (OLED) together with the substrate (SUB). The encapsulator (EN) may be formed into a substrate shape or a thin film encapsulator shape.

In an exemplary embodiment, the display panel (DP) may be the organic light emitting diode display device including the organic light emitting element (OLED). In an exemplary embodiment, a display panel may be various display devices such as liquid crystal displays (LCDs), plasma displays (PDs), field emission displays (FEDs), electrophoretic displays (EPDs), and electrowetting displays (EWDs).

The display panel (DP) may display an image using the organic light emitting element (OLED), and the touch panel (TSP) sensing a touch may be positioned on the display panel (DP).

Figure 2:
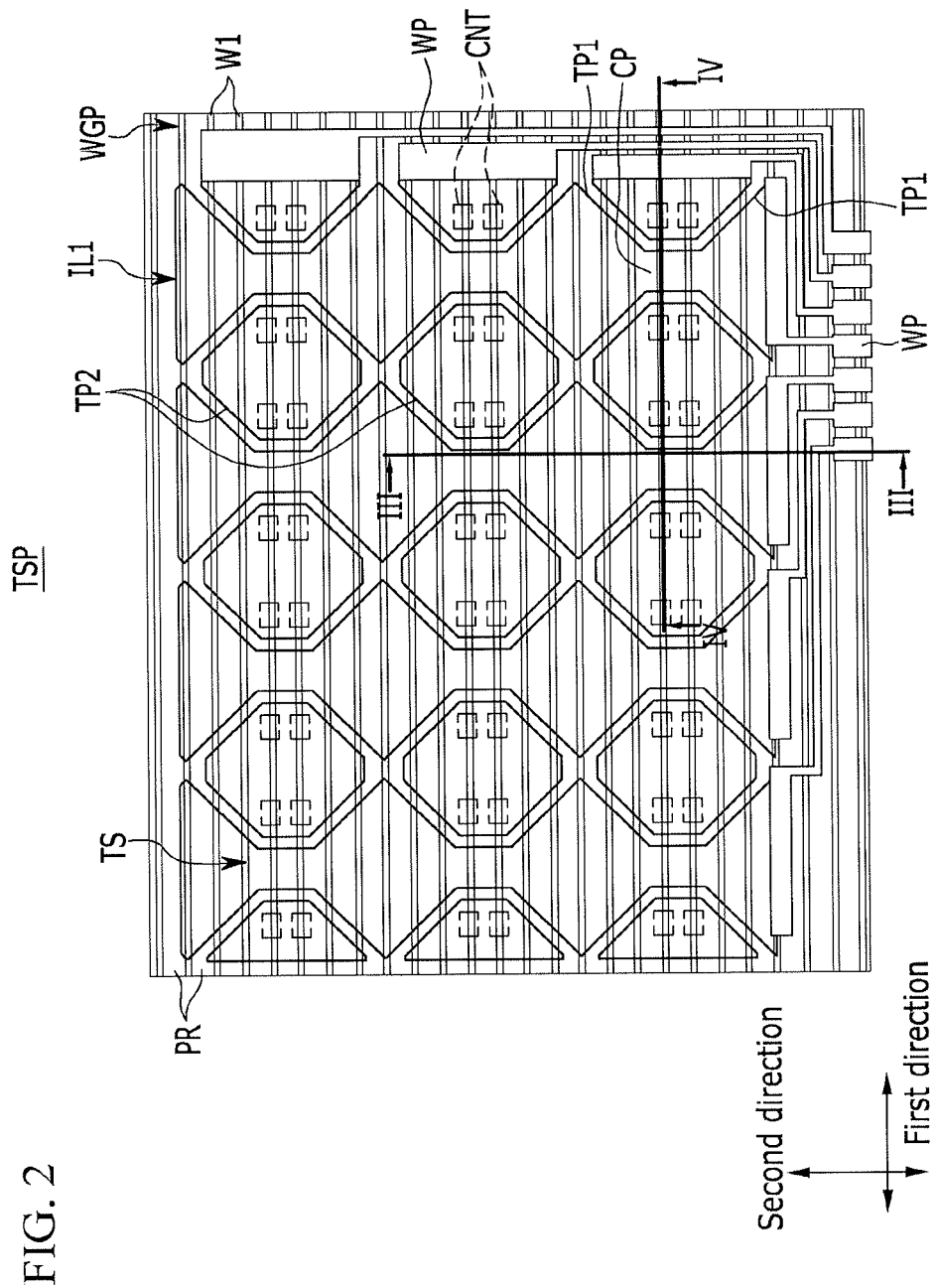
FIG. 2 illustrates a top plan view of a touch panel of the organic light emitting diode display device illustrated in FIG. 1.
Figure 3:
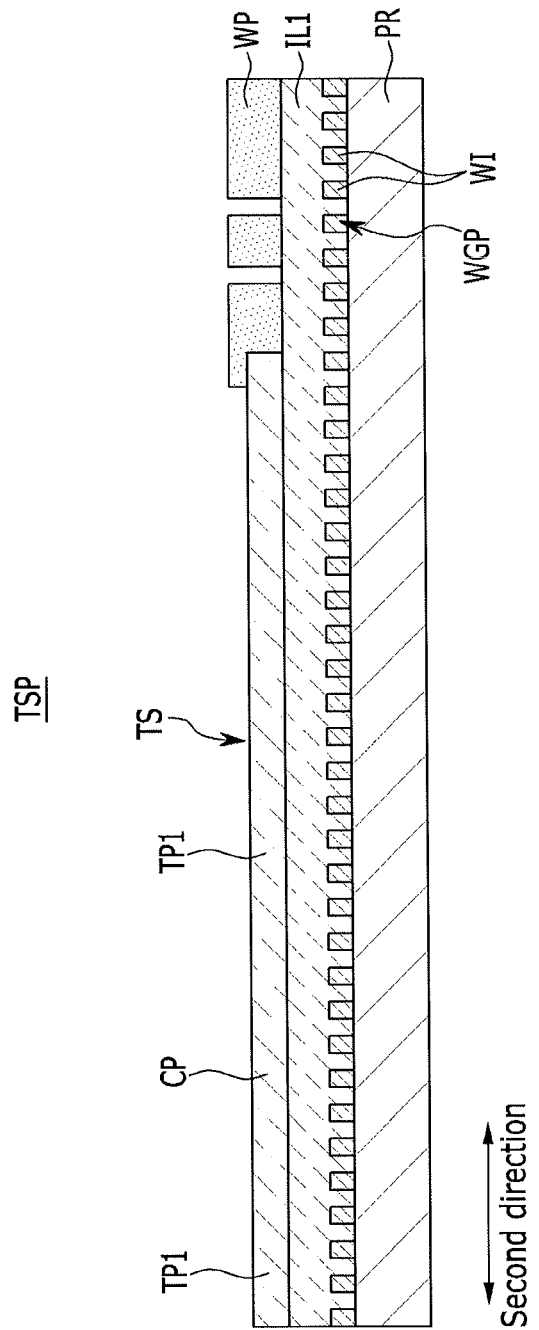
FIG. 3 illustrates a cross-sectional view taken along a line III-III of FIG. 2.
Figure 4:
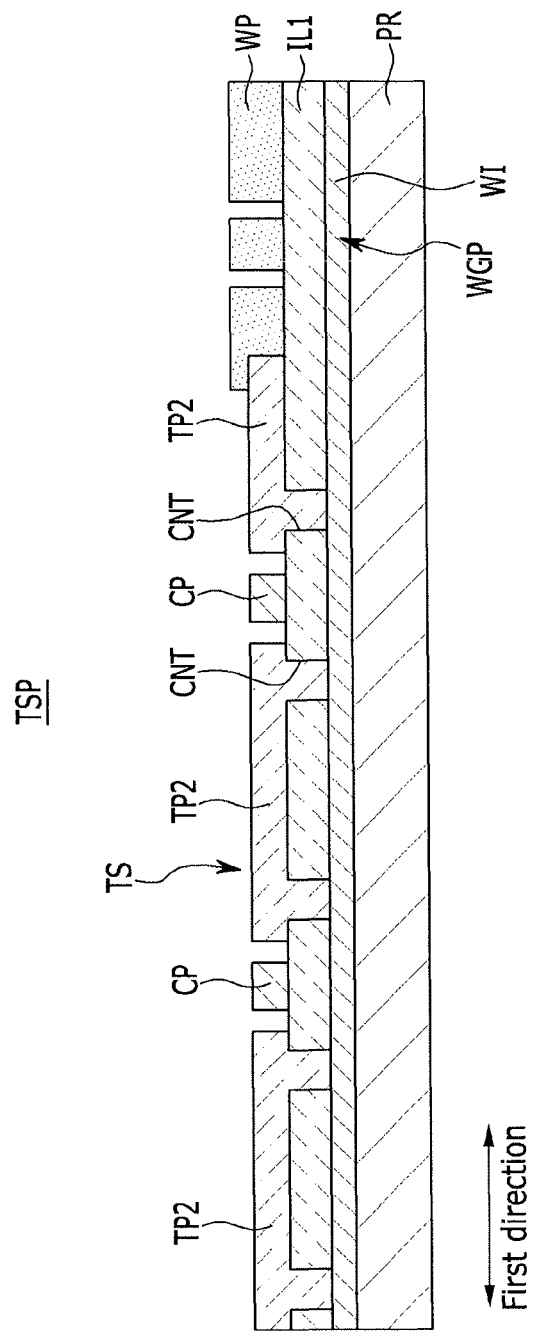
FIG. 4 illustrates a cross-sectional view taken along a line IV-IV of FIG. 2.

FIG. 2 illustrates a top plan view of a touch panel of the organic light emitting diode display device illustrated in FIG. 1. FIG. 3 illustrates a cross-sectional view taken along a line of FIG. 2. FIG. 4 illustrates a cross-sectional view taken along a line IV-IV of FIG. 2.

As illustrated in FIG. 2 to FIG. 4, the touch panel (TSP) may sense a touch and may include a phase retardation film (PR), a wire grid polarizer (WGP), a touch sensor unit (TS).

The phase retardation film (PR) may be positioned on the display panel (DP) and may etard a phase of light incident into the phase retardation film (PR). The phase retardation film (PR) may be a $\lambda/4$ phase retardation film that may retard a phase of an incident light by $\frac{1}{4}$. The phase retardation film (PR) may include a uniaxially oriented film, a biaxially oriented film, or an inverse dispersion phase difference film. The phase retardation film (PR) may transform the polarization of the incident light from linear polarization to circular polarization or from circular polarization to linear polarization. The phase retardation film (PR) may include, for example, a birefringence film including a polymer such as, for example, polystyrene, polycarbonate, polyvinylalcohol, polypropylene, polymethylmethacrylate, polyolefine, polyarylate, polyamide, cycloolefin polymer, cycloolefin copolymer, or triacetylcelluose, an oriented film of a liquid crystal polymer, and a film including an oriented layer of a liquid crystal polymer.

The wire grid polarizer (WGP) may be formed on the phase retardation film PR), and for example, may be formed on a front surface of the phase retardation film (PR). The wire grid polarizer (WGP) may include a plurality of wires (WI). Each of the plurality of wires (WI) may extend in a first direction on a surface of the phase retardation film (PR), and may be spaced from each other in a second direction intersecting with, e.g., orthogonal to, the first direction.

The wire grid polarizer (WGP) may be a polarizer generating polarization using the plurality of wires (WI) and may have a structure having a wire grid pattern in which the plurality of wires (WI) are periodically arranged in nano size in parallel with each other.

In the wire grid polarizer (WGP), if a distance between adjacent wires (WI) among the plurality of wires (WI) is shorter than a wavelength of an incident light incident into the wire grid polarizer (WGP), diffraction may not occur. The wire grid polarizer (WGP) may transmit TM (Transverse Magnetic) polarization of the incident light as a component having a vibration direction orthogonal to the plurality of wires (WI) and may reflect TE (Transverse Electric) polarization of the incident light as a component having a vibration direction parallel with the plurality of wires (WI). For example, the wire grid polarizer (WGP) may selectively transmit linear polarization of the incident light and may reflect the other polarizations.

The touch sensor unit (TS) may be formed on the phase retardation film (PR), and may be adjacent to the wire grid polarizer (WGP), e.g., between adjacent wires (WI) of the wire grid polarizer (WGP) in the second direction. The touch sensor unit (TS) may be positioned on the wire grid polarizer (WGP). The touch sensor unit (TS) may include a first insulating layer IL1, a first touch pad unit TP1, a connection unit (CP), a second touch pad unit TP2, and a wiring unit (WP).

The first insulating layer IL1 may cover the wire grid polarizer (WGP). The first insulating layer IL1 may include a contact hole (CNT) exposing a part of the wires (WI) extended in the first direction. A plurality of contact holes (CNT) may be disposed to be spaced from each other in the first direction. The first insulating layer IL1 may include an organic material or an inorganic material.

The first touch pad unit TP1 may be positioned on the first insulating layer IL1 and may be formed into a capacitance-type unit together with the adjacent second touch pad unit TP2. A plurality of first touch pad units TP1 may be disposed to be spaced from each other in the second direction. The plurality of first touch pad units TP1 may be connected to each other by the connection units (CP), and the plurality of first touch pad units TP1 and the connection units (CP) may be integrally formed into a touch line. Such a touch line may extend in the second direction, and the adjacent touch line may be disposed to be spaced from each other in the first direction.

The connection units (CP) may be positioned on the first insulating layer IL1 and may connect the plurality of first touch pad units TP1 to each other.

The first touch pad units TP1 and the connection units (CP) may be integrally formed, and the first touch pad units TP1 and the connection units (CP) may respectively include light-transmitting conductive layers including indium tin oxide (ITO), indium zinc oxide (IZO), or a conductive polymer.

The second touch pad unit TP2 may be positioned on the first insulating layer IL1, and may be formed into a capacitance-type unit together with the adjacent first touch pad unit TP1. A plurality of second touch pad units TP2 may be disposed to be spaced from each other in the first direction. The plurality of second touch pad units TP2 may be respectively connected to the wires (WI) of the wire grid polarizer (WGP) via the contact holes (CNT), and the adjacent second touch pad units TP2 may be connected to each other by the wires (WI). The plurality of second touch pad units TP2 and the wires (WI) may be formed into a touch line. Such a touch line may extend in the first direction, and the adjacent touch line may be disposed to be spaced from each other in the second direction.

The second touch pad units TP2 may be positioned on the same layer as the first touch pad units TP1 and the connection units (CP) and may be formed on the first insulating layer IL1 simultaneously with the first touch pad units TP1 and the connection units (CP). The second touch pad units TP2 may include the same material as the first touch pad units TP1 and the connection units (CP). The second touch pad units TP2 may include the same light-transmitting conductive layers including indium tin oxide (ITO), indium zinc oxide (IZO), or a conductive polymer as the first touch pad units TP1 and the connection units (CP).

The adjacent second touch pad units TP2 may be connected to each other by the wire (WI) via the contact hole (CNT), and the wire (WI) may be formed into a bridge shape to connect the adjacent second touch pad units TP2 to each other.

The wiring unit (WP) may be positioned on the first insulating layer IL1, and may correspond to an outer region of the phase retardation film (PR). The wiring unit (WP) may be connected to each of the first touch pad unit TP1 and the second touch pad unit TP2. The wiring unit (WP) may connect each of first touch pad unit TP1 and the second touch pad unit TP2 to a non-illustrated touch controller, and may include an opaque conductive material such as a metal or a transparent conductive material.

As described above, the organic light emitting diode display device according to an exemplary embodiment may include the phase retardation film (PR) and the touch panel (TSP) including the wire grid polarizer (WGP) on the display panel (DP) displaying an image, and the organic light emitting diode display device may be capable of sensing a touch while simultaneously suppressing the light emitting element (OLED) from being reflected by an incident light incident into the organic light emitting diode display device from the outside and being recognized from the outside. The organic light emitting diode display device may be capable of sensing a touch while simultaneously suppressing light reflection by external light.

In the organic light emitting diode display device according to an exemplary embodiment, the touch panel (TSP) may include the phase retardation film (PR), the wire grid polarizer (WGP), and the touch sensor unit (TS) formed on the phase retardation film (PR), the touch panel (TSP) may be slim, and flexibility of the touch panel (TSP) may be improved. The organic light emitting diode display device may be slim provide improved flexibility.

Provided are a touch panel (TSP), which may be capable of suppressing light reflection by external light and may be slim, flexibility thereof may be improvement, for example, due to the phase retardation film (PR), the wire grid polarizer (WGP), and the touch sensor unit (TS) included therein, and an organic light emitting diode display device including the same.

Hereinafter, referring to FIG. 5, a touch panel according to an exemplary embodiment will be descried. Hereinafter, components other than the components of the touch panel in the organic light emitting diode display device according to the above-described exemplary embodiment will be described.

Figure 5:
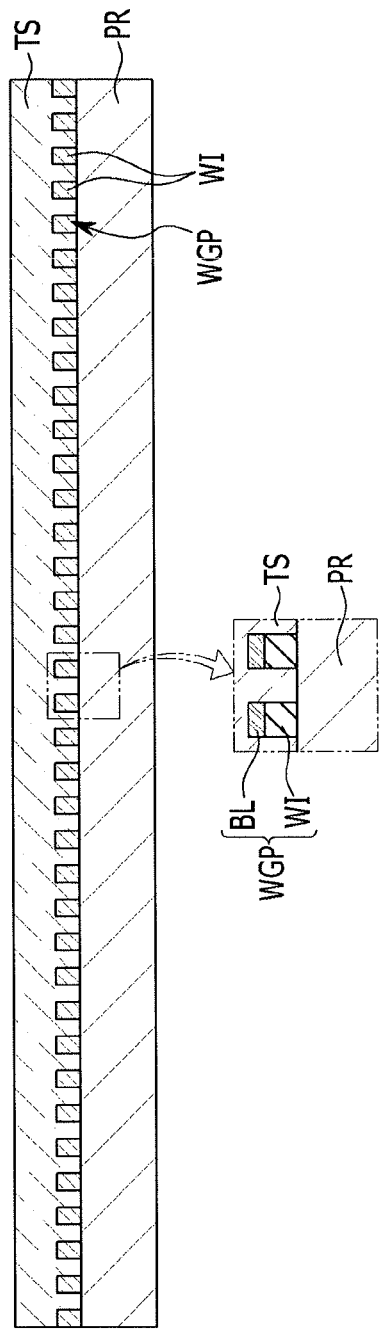
FIG. 5 illustrates a cross-sectional view of a touch panel according to an exemplary embodiment.

FIG. 5 illustrates a cross-sectional view of a touch panel according to an exemplary embodiment.

As illustrated in FIG. 5, a touch panel (TSP) according to an exemplary embodiment senses a touch, and may include a phase retardation film (PR), a wire grid polarizer (WGP), and a touch sensor unit (TS).

The wire grid polarizer (WGP) may further include a blackening layer (BL) formed on each surface of the plurality of wires (WI).

The blackening layer (BL) may include a conductive material and may be formed on each surface of the plurality of wires (WI). The blackening layer (BL) may absorb light and may suppress light incident into the wires (WI) from the outside from being reflected by the wires (WI).

In the touch panel (TSP) according to an exemplary embodiment, the wire grid polarizer (WGP) may include the blackening layer (BL) formed on the surfaces of the wires (WI), and, the touch panel (TSP) may suppress light incident into the wires (WI) from the outside from being reflected by the wires (WI). The touch panel (TSP) may be capable of suppressing the wires (WI) from being reflected by external light and being recognized from the outside.

Hereinafter, referring to FIG. 6, a touch panel according to an exemplary embodiment will be described. Hereinafter, components other than the components of the touch panel in the organic light emitting diode display device according to the above-described exemplary embodiment will be described.

Figure 6:
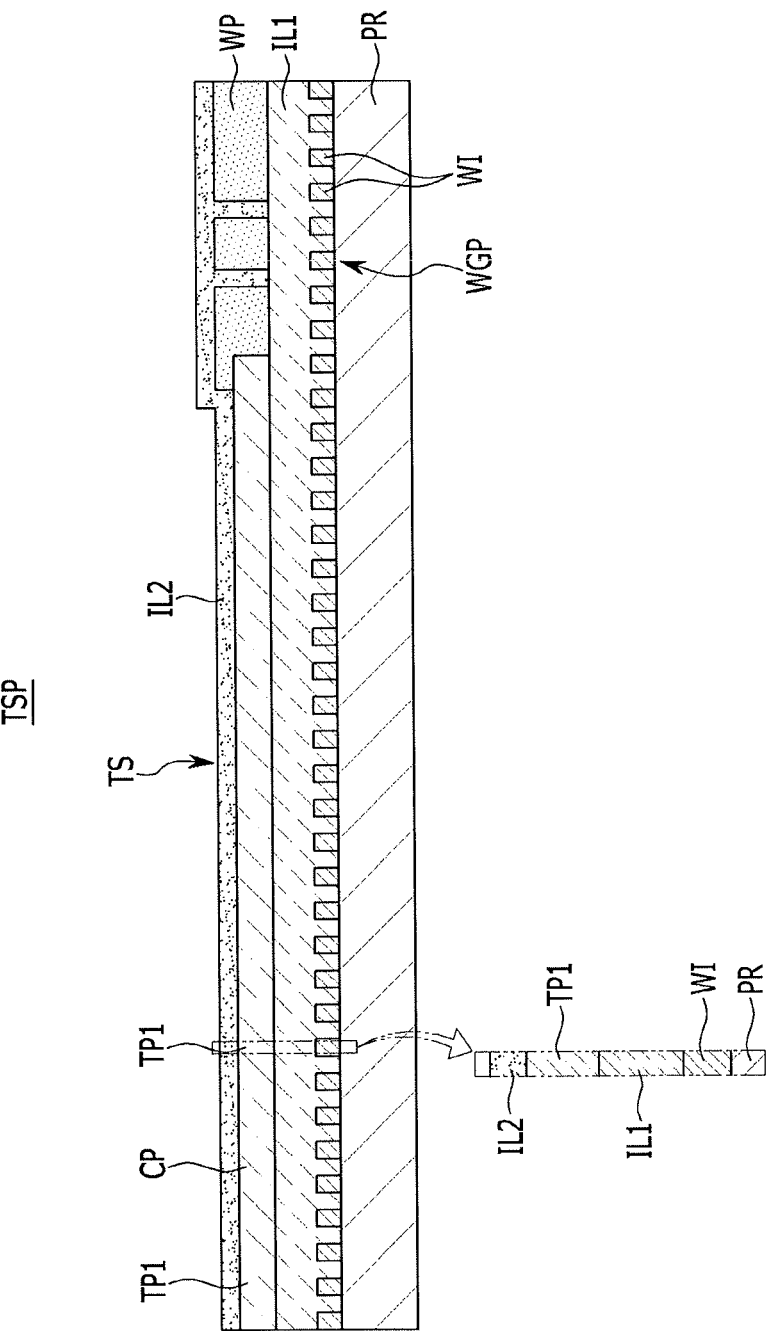
FIG. 6 illustrates a cross-sectional view of a touch panel according to an exemplary embodiment.

FIG. 6 illustrates a cross-sectional view of a touch panel according to an exemplary embodiment.

As illustrated in FIG. 6, a touch panel (TSP) according to an exemplary embodiment may include a phase retardation film (PR), a wire grid polarizer (WGP), and a touch sensor unit (TS).

The touch sensor unit (TS) may be formed on the phase retardation film (PR), and may be adjacent to the wire grid polarizer (WGP). The touch sensor unit (TS) may be positioned on the wire grid polarizer (WGP). The touch sensor unit (TS) may include a first insulating layer IL1, a first touch pad unit TP1, a connection unit (CP), a second touch pad unit TP2, a second insulating layer IL2, and a wiring unit (WP).

The first touch pad unit TP1, the connection unit (CP), the second touch pad unit may have a structure in which a first light-transmitting conductive layer including indium tin oxide (ITO), indium zinc oxide (IZO), or a conductive polymer, a metal thin film layer including silver (Ag) or gold (Au), and a second light-transmitting conductive layer are sequentially laminated, and may include a light semi-transmitting conductive layer on the whole.

The second insulating layer IL2 may cover the first touch pad unit TP1, the connection unit (CP), and the second touch pad unit, and may include an organic material or an inorganic material.

Each of a thickness of the first insulating layer IL1 and a thickness of the second insulating layer IL2 may be regulated such that a first light reflected by wires (WI) of the wire grid polarizer and a second light reflected by the first touch pad unit TP1, the connection unit (CP), and the second touch pad unit generate destructive interference, and may be reduced or eliminated. The first light incident into the wire grid polarizer (WGP) from the outside and reflected by the wires (WI) may be destructively interfered with by the second light reflected by the first touch pad unit TP1, the connection unit (CP), and the second touch pad unit TP2, may be reduced or eliminated, and the first light reflected by the wire grid polarizer (WGP) may be suppressed from being recognized from the outside.

In the touch panel (TSP) according to an exemplary embodiment, the touch sensor unit (TS) may include the thickness-regulated first insulating layer IL1 and second insulating layer IL2, and the touch panel (TSP) may suppress an incident light incident into the wires (WI) from the outside from being reflected by the wires (WI) and being recognized from the outside. The touch panel (TSP) may be capable of suppressing the wires (WI) from being reflected by external light and being recognized from the outside.

Hereinafter, referring to FIG. 7, a touch panel according to an exemplary embodiment will be described. Hereinafter, components other than the components of the touch panel in the organic light emitting diode display device according to the above-described exemplary embodiment will be described.

Figure 7:
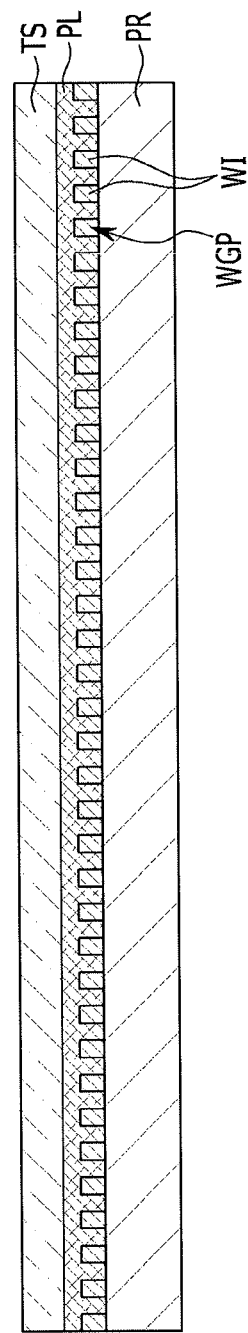
FIG. 7 illustrates a cross-sectional view of a touch panel according to an exemplary embodiment.

FIG. 7 illustrates a cross-sectional view of a touch panel according to an exemplary embodiment.

As illustrated in FIG. 7, a touch panel (TSP) according to an exemplary embodiment senses a touch and may include a phase retardation film (PR), a wire grid polarizer (WGP), a protective layer (PL), and a touch sensor unit (TS).

The protective layer (PL) may cover the wire grid polarizer (WGP) and prevent a short circuit between the wire grid polarizer (WGP) and the touch sensor unit (TS).

The touch sensor unit (TS) may be positioned on the wire grid polarizer (WGP) with the protective layer (PL) interposed therebetween. The touch sensor unit (TS) may be formed into a self-capacitance type touch sensor having various structures, or a mutual capacitance type touch sensor having various structures. The touch sensor unit (TS) may be formed to have a structure that may sense a touch.

As described above, the touch panel (TSP) according to an exemplary embodiment may include the phase retardation film (PR) and the wire grid polarizer (WGP), and the touch panel (TSP) may be capable of sensing a touch while simultaneously suppressing a display panel, which may be positioned on a rear surface side of the touch panel (TSP), from being reflected by an incident light incident into the display panel from the outside through the touch panel (TSP) and being recognized from the outside. The touch panel (TSP) may be capable of sensing a touch while simultaneously suppressing light reflection by external light.

The touch panel (TSP) according to an exemplary embodiment may include the phase retardation film (PR), the wire grid polarizer (WGP), and the touch sensor unit (TS) positioned on the wire grid polarizer (WGP) and formed on the phase retardation film (PR), and the touch panel (TSP) may be slim and flexibility of the touch panel (TSP) may be improved.

The touch panel (TSP) may be capable of suppressing light reflection by external light and may be slim, and flexibility thereof may be improved, for example, due to the phase retardation film (PR), the wire grid polarizer (WGP), and the touch sensor unit (TS) included therein.

Hereinafter, referring to FIG. 8, a touch panel according to an exemplary embodiment will be described. Hereinafter, components other than the components of the touch panel in the organic light emitting diode display device according to the above-described exemplary embodiment will be described.

Figure 8:
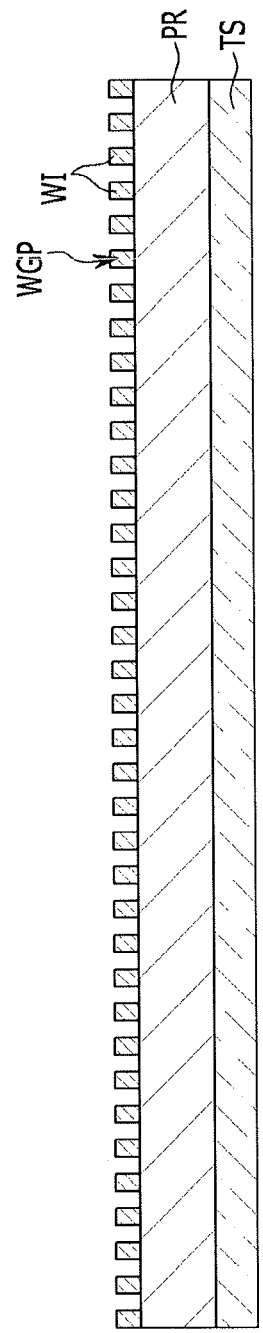
FIG. 8 illustrates a cross-sectional view of a touch panel according to an exemplary embodiment.

FIG. 8 illustrates a cross-sectional view of a touch panel according to an exemplary embodiment.

As illustrated in FIG. 8, a touch panel (TSP) according to an exemplary embodiment senses a touch and may include a phase retardation film (PR), a wire grid polarizer (WGP), and a touch sensor unit (TS).

The wire grid polarizer (WGP) may be formed on a front surface of the phase retardation film (PR).

The touch sensor unit (TS) may be formed on a rear surface of the phase retardation film (PR). The touch sensor unit (TS) may be formed into a self-capacitance type touch sensor having various structures, or a mutual capacitance type touch sensor having various structures. The touch sensor unit (TS) may be formed to have a structure that may sense a touch.

As described above, the touch panel (TSP) according to an exemplary embodiment may include the phase retardation film (PR) and the wire grid polarizer (WGP), and the touch panel (TSP) may be capable of sensing a touch while simultaneously suppressing a display panel, which may be positioned on a rear surface side of the touch panel (TSP), from being reflected by an incident light incident into the display panel from the outside through the touch panel (TSP) and being recognized from the outside. The touch panel (TSP) may be capable of sensing a touch while simultaneously suppressing light reflection by external light.

The touch panel (TSP) according to an exemplary embodiment may include the phase retardation film (PR), the wire grid polarizer (WGP), and the touch sensor unit (TS) positioned on the wire grid polarizer (WGP) and formed on the phase retardation film (PR), and, the touch panel (TSP) may be slim and flexibility of the touch panel (TSP) may be improved.

The touch panel (TSP) may be capable of suppressing light reflection by external light and may be slim, and flexibility thereof may be improved, for example, due to the phase retardation film (PR), the wire grid polarizer (WGP), and the touch sensor unit (TS) included therein.

By way of summation and review, an organic light emitting diode display device may include a phase retardation film and a polarizer disposed on a display panel including an organic light emitting element to suppress light reflection by external light by the organic light emitting element and a touch panel sensing a touch attached to the phase retardation film and an upper portion or a lower portion of the polarizer.

Provided are a touch panel, which may be capable of suppressing light reflection by external light and may be slim, and flexibility thereof may be improved, and an organic light emitting diode display device including the same.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A touch panel, comprising:
a phase retardation film;
a wire grid polarizer on the phase retardation film, the wire grid polarizer including a plurality of wires; and
a touch sensor unit on the phase retardation film, the touch sensor unit being adjacent to the wire grid polarizer, wherein
the plurality of wires extend in a first direction on the phase retardation film, and are spaced from each other in a second direction intersecting the first direction, wherein
the touch sensor unit is on the wire grid polarizer, wherein the touch sensor unit includes:
a first insulating layer covering the wire grid polarizer, the first insulating layer including a plurality of contact holes spaced from each other in the first direction, the plurality of contact holes exposing a part of the wires of the wire grid polarizer;
a plurality of first touch pad units on the first insulating layer, the first touch pad units being spaced from each other in the second direction;
connection units on the first insulating layer, the connection units connecting the plurality of first touch pad units to each other; and
a plurality of second touch pad units on the first insulating layer, the second touch pad units being spaced from each other in the first direction, the second touch pad units being connected to one of the wires of the wire grid polarizer via the contact holes.

2. The touch panel as claimed in claim 1, wherein the wire grid polarizer further includes a blackening layer on surfaces of the wires.

3. The touch panel as claimed in claim 1, wherein the first touch pad units and the connection units are integrally formed.

4. The touch panel as claimed in claim 1, wherein the second touch pad units are on a same layer as the first touch pad units.

5. The touch panel as claimed in claim 1, wherein the first touch pad units and the second touch pad units each include light-transmitting conductive layers.

6. The touch panel as claimed in claim 1, wherein the first touch pad units and the second touch pad units each include light semi-transmitting conductive layers.

7. The touch panel as claimed in claim 6, further comprising a second insulating layer covering the first touch pad units and the second touch pad units,
wherein each of a thickness of the first insulating layer and a thickness of the second insulating layer is regulated such that a first light reflected by the wire grid polarizer and a second light reflected by the first touch pad units and the second touch pad units generate destructive interference.

8. The touch panel as claimed in claim 1, wherein the phase retardation film is a $\lambda/4$ phase retardation film.

9. An organic light emitting diode display device, comprising:
a display panel including an organic light emitting element; and
a touch panel including a phase retardation film on the display panel, a wire grid polarizer including a plurality of wires on the phase retardation film, and a touch sensor unit on the phase retardation film, the touch sensor unit being adjacent to the wire grid polarizer, wherein
the plurality of wires extend in a first direction on the phase retardation film, and are spaced from each other in a second direction intersecting the first direction, wherein the touch sensor unit is on the wire grid polarizer, wherein
the touch sensor unit includes:
a first insulating layer covering the wire grid polarizer, the first insulating layer including a plurality of contact holes spaced from each other in the first direction, the plurality of contact holes exposing a part of the wires of the wire grid polarizer;
a plurality of first touch pad units on the first insulating layer, the first touch pad units being spaced from each other in the second direction;
connection units on the first insulating layer, the connection units connecting the plurality of first touch pad units to each other; and
a plurality of second touch pad units on the first insulating layer, the second touch pad units being spaced from each other in the first direction, the second touch pad units being connected to one of the wires of the wire grid polarizer via the contact holes.

* * * * *